United States Patent
Long et al.

(10) Patent No.: US 6,169,302 B1
(45) Date of Patent: Jan. 2, 2001

(54) DETERMINATION OF PARASITIC CAPACITANCE BETWEEN THE GATE AND DRAIN/SOURCE LOCAL INTERCONNECT OF A FIELD EFFECT TRANSISTOR

(75) Inventors: Wei Long, Sunnyvale; Qi Xiang, Santa Clara; Yowjuang W. Liu, San Jose, all of CA (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/361,698

(22) Filed: Jul. 27, 1999

(51) Int. Cl.[7] .......................... H01L 23/58; H01L 29/76; H01L 29/94; H01L 31/062; H01L 31/113
(52) U.S. Cl. .......................... 257/288; 257/48; 257/300; 257/401
(58) Field of Search .............................. 257/48, 288, 296, 257/300, 401

(56) References Cited

U.S. PATENT DOCUMENTS

| | | | |
|---|---|---|---|
| 5,552,621 | * | 9/1996 | Kowalski ........................ 257/321 |
| 5,767,542 | * | 6/1998 | Nakamura ....................... 257/296 |

* cited by examiner

*Primary Examiner*—Ngan V. Ngo
(74) *Attorney, Agent, or Firm*—Monica H. Choi

(57) ABSTRACT

The present invention accurately determines a first parasitic capacitance component between a conductive gate region to a drain local interconnect of a real field effect transistor, and determines a second parasitic capacitance component between the conductive gate region to a source local interconnect of the real field effect transistor. A virtual field effect transistor is fabricated on a dielectric in order to determine the parasitic capacitance component between just the gate and the drain or source local interconnect of the real field effect transistor. The virtual field effect transistor includes a virtual drain local interconnect, a virtual source local interconnect, and a virtual conductive gate region fabricated on the dielectric with a respective size and positions relative to each other that are substantially the same as that of the drain and source local interconnects and the gate, respectively, of the real field effect transistor. In this manner, the first parasitic capacitance component between the conductive gate region of the real field effect transistor to the drain local interconnect of the real field effect transistor is a first capacitance measured between the virtual conductive gate region and the virtual drain local interconnect of the virtual field effect transistor of the present invention. Similarly, the second parasitic capacitance component between the conductive gate region of the real field effect transistor to the source local interconnect of the real field effect transistor is a second capacitance measured between the virtual conductive gate region and the virtual source local interconnect of the virtual field effect transistor of the present invention.

15 Claims, 3 Drawing Sheets

US 6,169,302 B1

DETERMINATION OF PARASITIC CAPACITANCE BETWEEN THE GATE AND DRAIN/SOURCE LOCAL INTERCONNECT OF A FIELD EFFECT TRANSISTOR

TECHNICAL FIELD

The present invention relates generally to field effect transistors such as MOSFETs (Metal Oxide Semiconductor Field Effect Transistors), and more particularly, to a device for determining the component of the parasitic capacitance between the gate and the drain or source local interconnect of a field effect transistor.

BACKGROUND OF THE INVENTION

Field effect transistors, such as MOSFETs (Metal Oxide Semiconductor Field Effect Transistors), are now widely used within integrated circuits. Referring to FIG. 1, a cross sectional view of a typical MOSFET 102, as known to one of ordinary skill in the art, includes a drain region 104 and a source region 106. A channel region 108 is disposed between the drain region 104 and the source region 106. A gate dielectric 110 is disposed on the channel region 108, and a conductive gate region 112 is disposed on the gate dielectric 110. A drain local interconnect 114 is coupled to the drain region 104 for providing electrical connection to the drain region 104, and a source local interconnect 116 is coupled to the source region 106 for providing electrical connection to the source region 104. A dielectric region 118 surrounds the drain local interconnect 114, the source local interconnect 116, and the conductive gate region 112.

Parasitic capacitance components are formed by these device regions of the MOSFET 102. Referring to FIG. 1, a gate to drain parasitic capacitance component 120 is formed between the conductive gate region 112 and the drain region 104 of the MOSFET 102. The gate to drain parasitic capacitance component 120 is formed predominantly from the overlap of the gate dielectric 110 over the drain region 104 and from the fringing electric field between the conductive gate region 112 and the drain region 104, as known to one of ordinary skill in the art of electronics. Similarly, a gate to source parasitic capacitance component 122 is formed between the conductive gate region 112 and the source region 106 of the MOSFET 102. The gate to source parasitic capacitance component 122 is formed predominantly from the overlap of the gate dielectric 110 over the source region 106 and from the fringing electric field between the conductive gate region 112 and the source region 106, as known to one of ordinary skill in the art of electronics.

In addition, referring to FIG. 1, a gate to drain local interconnect parasitic capacitance component 130 is formed between the conductive gate region 112 and the drain local interconnect 114. Similarly, a gate to source local interconnect parasitic capacitance component 132 is formed between the conductive gate region 112 and the source local interconnect 114.

In the prior art, the gate to drain parasitic capacitance component 120 and the gate to source parasitic capacitance component 122 are typically accounted for in device analysis and device modeling in the design of the integrated circuit having the MOSFET 102. However, the gate to drain local interconnect parasitic capacitance component 130 and the gate to source local interconnect parasitic capacitance component 132 are typically not included in such device analysis and device modeling in the design of the integrated circuit having the MOSFET 102. However, as device dimensions are further scaled down, the gate to drain local interconnect parasitic capacitance component 130 and the gate to source local interconnect parasitic capacitance component 132 become more significant parasitic capacitance components.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

As the dimensions of the MOSFET 102 are further scaled down to submicron and nanometer dimensions, the gate to drain local interconnect parasitic capacitance component 130 and the gate to source local interconnect parasitic capacitance component 132 become more significant parasitic capacitance components. Thus, such parasitic capacitance components need to be accounted for in device analysis and device modeling for an accurate design of the integrated circuit having the MOSFET 102. As a result, a mechanism for determining the gate to drain local interconnect parasitic capacitance component 130 and the gate to source local interconnect parasitic capacitance component 132 of the MOSFET 102 is desired.

SUMMARY OF THE INVENTION

Accordingly, a primary object of the present invention is to accurately determine a first parasitic capacitance component between a conductive gate region to a drain local interconnect of a real field effect transistor, and for determining a second parasitic capacitance component between the conductive gate region to a source local interconnect of the real field effect transistor.

Generally, with the present invention, a virtual field effect transistor is fabricated on a dielectric in order to determine the parasitic capacitance component between just the gate and the drain or source local interconnect of the real field effect transistor. The virtual field effect transistor of the present invention includes a virtual drain local interconnect fabricated on the dielectric. The virtual drain local interconnect has a size that is substantially equal to a size of the drain local interconnect of the real field effect transistor. In addition, the virtual field effect transistor of the present invention includes a virtual source local interconnect fabricated on the dielectric. The virtual source local interconnect has a size that is substantially equal to a size of the source local interconnect of the real field effect transistor. Also, the virtual field effect transistor of the present invention includes a virtual conductive gate region fabricated on the dielectric. The virtual conductive gate region has a size that is substantially equal to a size of the conductive gate region of the real field effect transistor.

The positions of the virtual drain local interconnect, the virtual source local interconnect, and the virtual conductive gate region, relative to each other on the dielectric, are substantially the same as positions of the drain local interconnect of the real field effect transistor, the source local interconnect of the real field effect transistor, and the conductive gate region of the real field effect transistor, relative to each other.

Furthermore, a virtual dielectric region is fabricated on the dielectric to surround the virtual drain local interconnect, the virtual source local interconnect, and the virtual conductive gate region. The virtual dielectric region is substantially the same as a dielectric region that surrounds the drain local interconnect of the real field effect transistor, the source local interconnect of the real field effect transistor, and the conductive gate region of the real field effect transistor.

The first parasitic capacitance component between the conductive gate region of the real field effect transistor to the drain local interconnect of the real field effect transistor is a first capacitance measured between the virtual conductive gate region and the virtual drain local interconnect. Similarly, the second parasitic capacitance component between the conductive gate region of the real field effect transistor to the source local interconnect of the real field effect transistor is a second capacitance measured between the virtual conductive gate region and the virtual source local interconnect.

The present invention may be used to particular advantage when the first parasitic capacitance component and the second parasitic capacitance component are used to determine a mismatch in a first distance, between the conductive gate region of the real field effect transistor and the drain local interconnect of the real field effect transistor, and a second distance, between the conductive gate region of the real field effect transistor and the source local interconnect of the real field effect transistor. The first parasitic capacitance component and the second parasitic capacitance component are dependent on the mismatch between such distances between the conductive gate region to the drain local interconnect and between the conductive gate region to the source local interconnect.

In this manner, the virtual field effect transistor includes a virtual drain local interconnect, a virtual source local interconnect, and a virtual conductive gate region fabricated on a dielectric. Thus, the gate to drain parasitic capacitance component and the gate to source parasitic capacitance component of a MOSFET are excluded for an accurate determination of just the gate to drain local interconnect parasitic capacitance component and the gate to source local interconnect parasitic capacitance component.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, and 5 refer to elements having similar structure and function.

DETAILED DESCRIPTION

Figure 1:
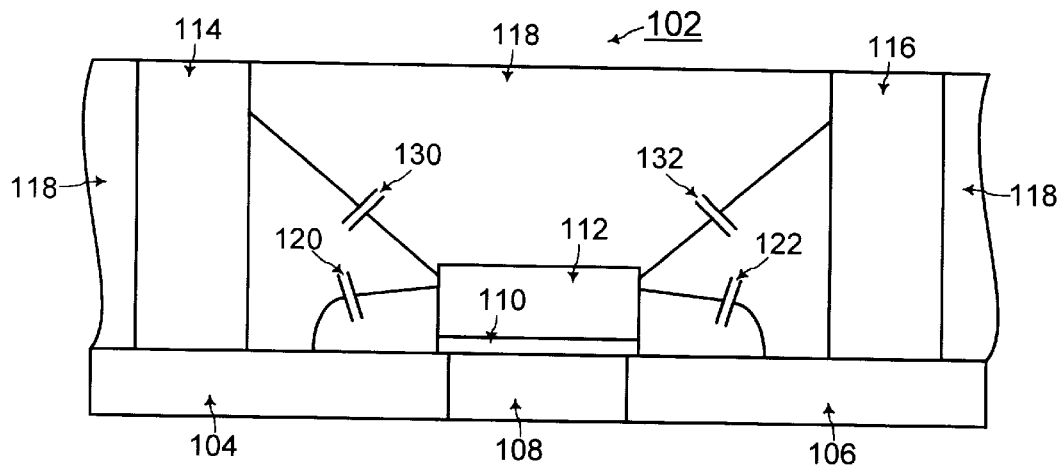
FIG. 1 shows a cross sectional view of a typical MOSFET (Metal Oxide Semiconductor Field Effect Transistor) having parasitic capacitance components from the gate of the MOSFET.
Figure 2:
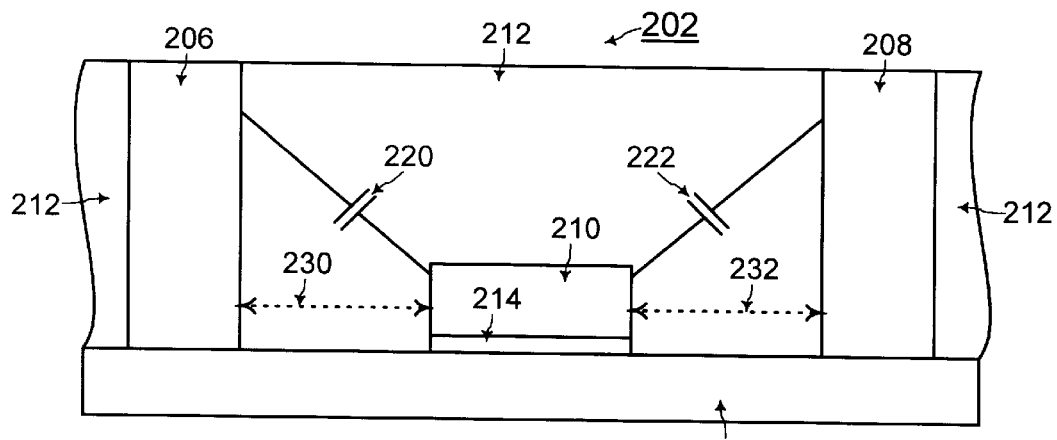
FIG. 2 shows a cross sectional view of a virtual field effect transistor for determining the gate to drain local interconnect parasitic capacitance component and the gate to source local interconnect parasitic capacitance component, according to the present invention.

Referring to FIG. 2, the present invention fabricates a virtual field effect transistor 202 which mirrors the drain local interconnect 114, the source local interconnect 116, and the conductive gate region 112 of the real MOSFET 102 of FIG. 1. The virtual field effect transistor 202 of the present invention is fabricated on a dielectric 204. The dielectric 204 may be relatively thick oxide. The dielectric 204 may for example be shallow trench isolation oxide as known to one of ordinary skill in the art of integrated circuit fabrication. Alternatively, the dielectric 204 may be field oxide as known to one of ordinary skill in the art of integrated circuit fabrication. However, the present invention may be practiced when the dielectric 204 is any type of insulating material, as would be apparent to one of ordinary skill in the art from the description herein.

Referring to FIG. 2, the virtual field effect transistor 202 of the present invention includes a virtual drain local interconnect 206 fabricated on the dielectric 204. The virtual drain local interconnect 206 has a size that is substantially equal to a size of the drain local interconnect 114 of the real field effect transistor 102 of FIG. 1. In addition, the virtual field effect transistor 202 of the present invention includes a virtual source local interconnect 208 fabricated on the dielectric 204. The virtual source local interconnect 208 has a size that is substantially equal to a size of the source local interconnect 116 of the real field effect transistor 102 of FIG. 1. Also, the virtual field effect transistor of the present invention includes a virtual conductive gate region 210 fabricated on the dielectric 204. The virtual conductive gate region 210 has a size that is substantially equal to a size of the conductive gate region 112 of the real field effect transistor 102 of FIG. 1.

The virtual drain local interconnect 206, the virtual source local interconnect 208, and the virtual conductive gate region 210 fabricated on the dielectric 204 mirror the drain local interconnect 114 of the real field effect transistor 102, the source local interconnect 116 of the real field effect transistor 102, and the conductive gate region 112 of the real field effect transistor 102, respectively. Thus, the positions of the virtual drain local interconnect 206, the virtual source local interconnect 208, and the virtual conductive gate region 210, relative to each other on the dielectric 204, are substantially the same as positions of the drain local interconnect 114 of the real field effect transistor 102, the source local interconnect 116 of the real field effect transistor 102, and the conductive gate region 112 of the real field effect transistor 102, relative to each other.

Furthermore, a virtual dielectric region 212 is fabricated on the dielectric 204 to surround the virtual drain local interconnect 206, the virtual source local interconnect 208, and the virtual conductive gate region 210. The virtual dielectric region 212 is substantially the same as the dielectric region 118 that surrounds the drain local interconnect 114 of the real field effect transistor 102, the source local interconnect 116 of the real field effect transistor 102, and the conductive gate region 112 of the real field effect transistor 102.

Figure 3:
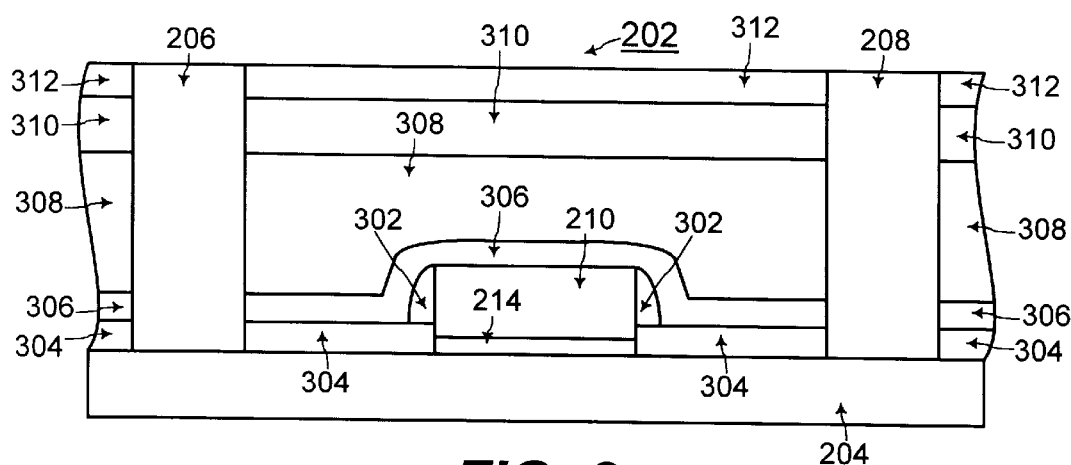
FIG. 3 shows a cross sectional view of the virtual field effect transistor of FIG. 2 with a virtual dielectric region that is substantially the same as a dielectric region within the MOSFET of FIG. 1, according to the present invention.

Thus, a virtual gate dielectric 214 is fabricated on the dielectric 204 under the virtual conductive gate region 210, and the virtual gate dielectric 214 is substantially the same as the gate dielectric 110 of the real MOSFET 102. In addition, referring to FIG. 3, spacers 302 may surround the virtual conductive gate region 210 and the conductive gate region 112 of the real MOSFET 102. Furthermore, the virtual dielectric region 212 and the dielectric region 118 of the real MOSFET 202 may be comprised of a plurality of dielectric regions with different dielectric constants. For example, a first dielectric region 304 may have a dielectric constant of 4.1. A second dielectric region 306 may have a dielectric constant of 6.8, and a third dielectric region 308 and a fourth dielectric region 310 may have a dielectric constant of 4.1. A fifth dielectric region 312 may have a dielectric constant of 6.8. The foregoing dielectric regions are by way of example only, and in any example, the virtual dielectric region 212 is substantially the same as the dielectric region 118 of the real MOSFET 102.

With such a virtual field effect transistor 202, the gate to drain local interconnect parasitic capacitance component 130 between the conductive gate region 112 of the real field effect transistor 102 to the drain local interconnect 114 of the real field effect transistor 102 is a first capacitance 220 measured between the virtual conductive gate region 210 and the virtual drain local interconnect 206. Similarly, the gate to source local interconnect parasitic capacitance component 132 between the conductive gate region 112 of the real field effect transistor 102 to the source local interconnect 116 of the real field effect transistor 102 is a second capacitance 222 measured between the virtual conductive gate region 210 and the virtual source local interconnect 208. The first capacitance 220 and the second capacitance 222 may be measured by using a conventional capacitance meter available to one of ordinary skill in the art of electronics.

In this manner, because the virtual drain local interconnect 206, the virtual source local interconnect 208, and the virtual conductive gate region 210 of the virtual field effect transistor 202 are on the dielectric 204, the first capacitance 220 is an accurate measure of just the gate to drain local interconnect parasitic capacitance component 130 without the gate to drain parasitic capacitance component 120. Similarly, the second capacitance 222 is an accurate measure of just the gate to source local interconnect parasitic capacitance component 132 without the gate to source parasitic capacitance component 122.

In addition, the measure of the first capacitance 220 between the virtual drain local interconnect 206 and the virtual conductive gate region 210 and the measure of the second capacitance 222 between the virtual source local interconnect 208 and the virtual conductive gate region 210 may be used to determine the mismatch in the distances from the drain local interconnect 114 to the conductive gate region 112 and from the source local interconnect 116 to the conductive gate region 112 within the MOSFET 102.

Referring to FIG. 2, a first distance 230 is a distance between the virtual drain local interconnect 206 and the virtual conductive gate region 210. The first distance 230 also reflects the distance between the drain local interconnect 114 of the real MOSFET 102 and the conductive gate region 112 of the real MOSFET 102. Similarly, a second distance 232 is a distance between the virtual source local interconnect 208 and the virtual conductive gate region 210. The second distance 232 also reflects the distance between the source local interconnect 116 of the real MOSFET 102 and the conductive gate region 112 of the real MOSFET 102.

Figure 4:
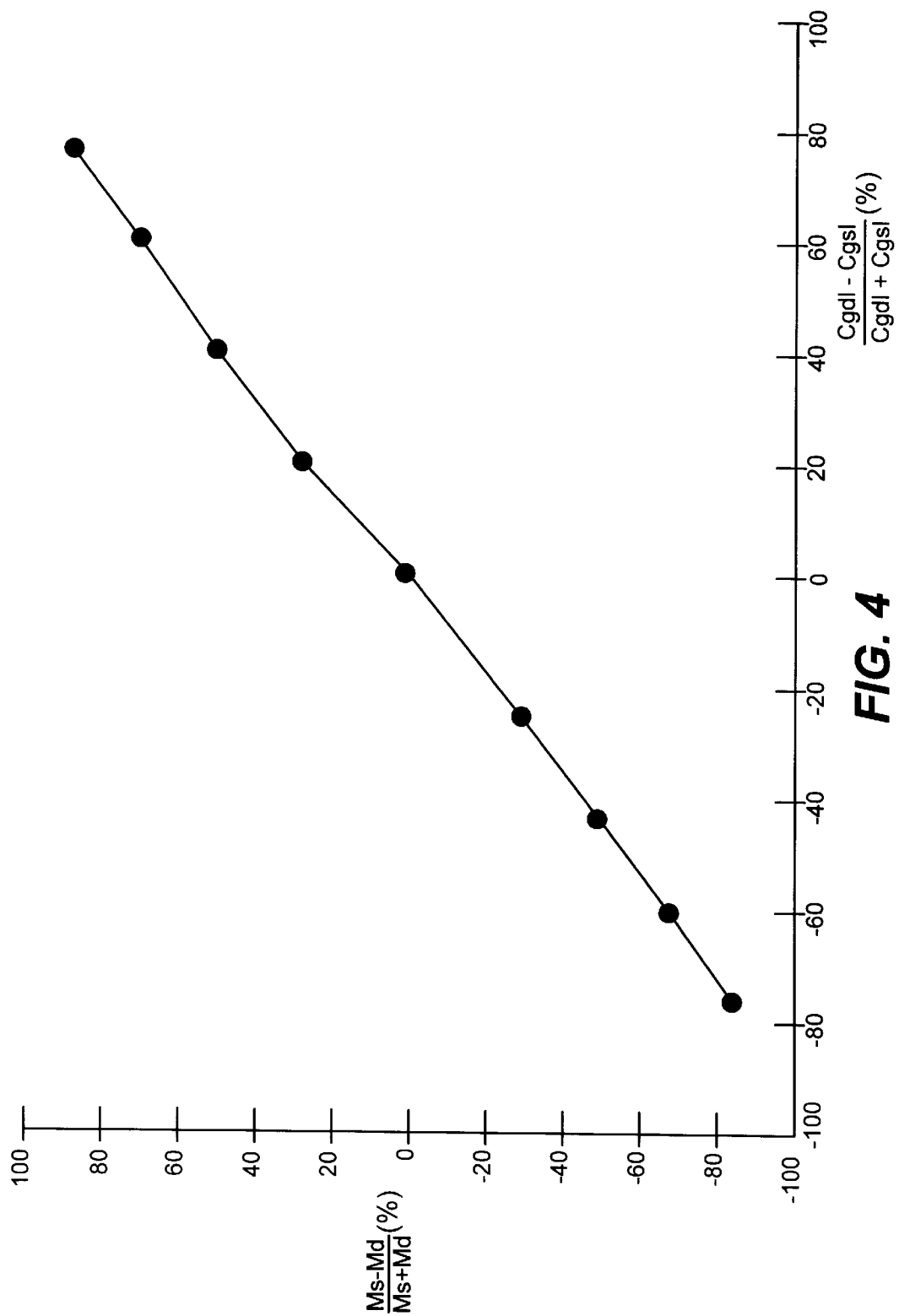
FIG. 4 is a simulated graph of the percentage difference in the gate to drain local interconnect parasitic capacitance component and the gate to source local interconnect parasitic capacitance component versus the percentage difference in the distances between the gate to the drain local interconnect and between the gate to the source local interconnect.

Referring to FIG. 4, a simulated graph is generated, using the simulation tool, Raphael, from Avant Corp. in Fremont, Calif., from entering in the dimensions of the MOSFET 102 into such a simulation tool, as available to one of ordinary skill in the art. The X-axis of the simulated graph of FIG. 4 has the percentage difference between the gate to drain local interconnect parasitic capacitance component 220 and the gate to source local interconnect parasitic capacitance component 222. "Cgdl" is the gate to drain local interconnect parasitic capacitance component 220 measured between the virtual conductive gate region 210 and the virtual drain local interconnect 206. "Cgsl" is the gate to source drain local interconnect parasitic capacitance component 222 measured between the virtual conductive gate region 210 and the virtual source local interconnect 208.

The Y-axis of the simulated graph of FIG. 4 has the percentage difference in the distances between the gate to the drain local interconnect 230 and between the gate to the source local interconnect 232. In the simulated graph of FIG. 4, "Md" is the first distance 230 between the virtual drain local interconnect 206 and the virtual conductive gate region 210, and "Ms" is the second distance 232 between the virtual source local interconnect 208 and the virtual conductive gate region 210.

From the simulated graph of FIG. 4, if the first distance 230 "Md" is substantially equal to the second distance 232 "Ms", then the gate to drain local interconnect parasitic capacitance component 220 "Cgdl" and the gate to source local interconnect parasitic capacitance component 222 "Cgsl" are substantially equal. A larger percentage difference between the first distance 230 "Md" and the second distance 232 "Ms" results in a corresponding larger percentage difference between the gate to drain local interconnect parasitic capacitance component 220 "Cgdl" and the gate to source local interconnect parasitic capacitance component 222 "Cgsl."

A respective simulated graph similar to the graph of FIG. 4 may be generated for each integrated circuit fabrication process. Then, by measuring the gate to drain local interconnect parasitic capacitance component 220 "Cgdl" and the gate to source local interconnect parasitic capacitance component 222 "Cgsl" the mismatch (i.e., the percentage difference) in the first distance 230 "Md" and the second distance 232 "Ms" may be determined from such a graph of FIG. 4.

Figure 5:
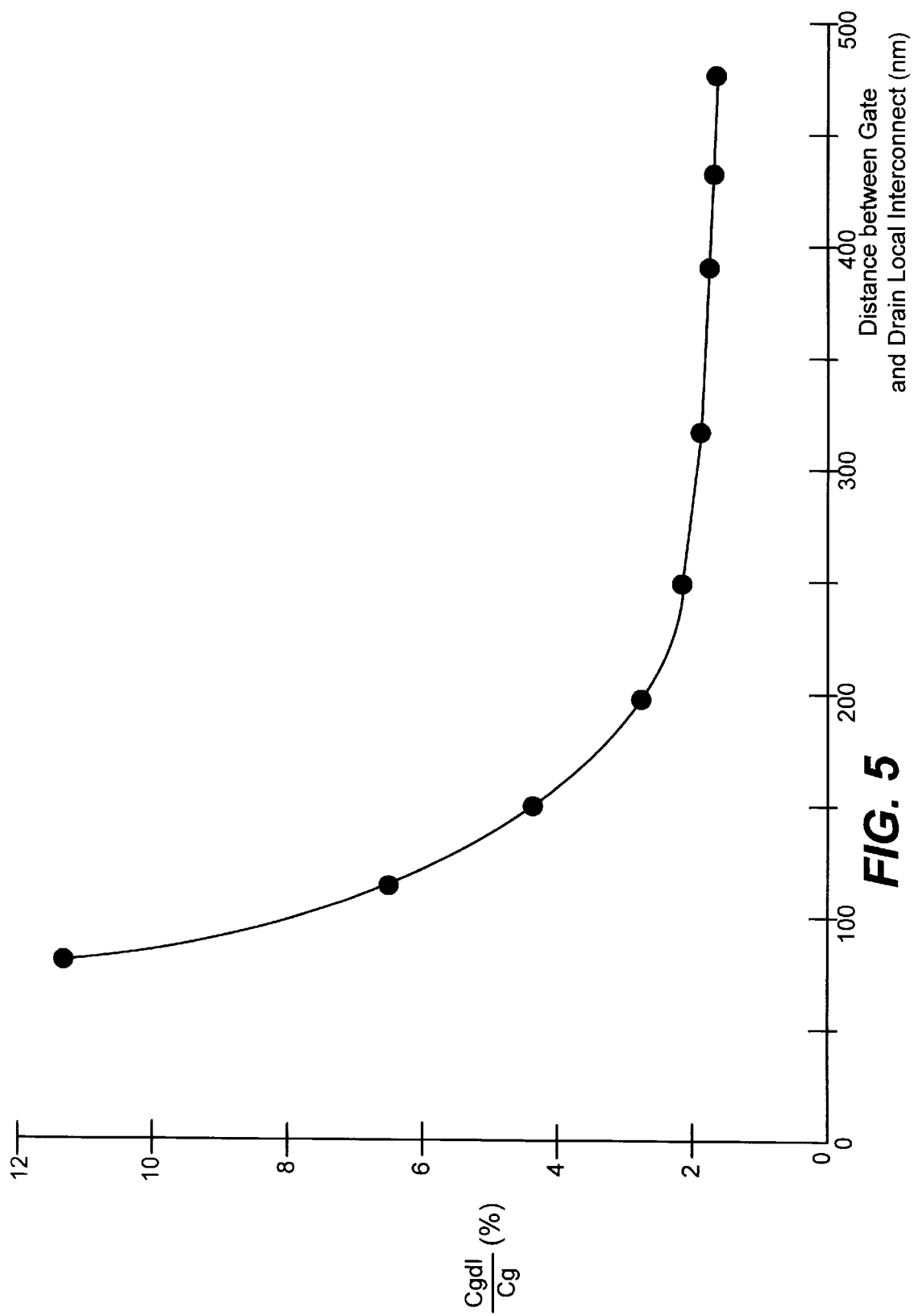
FIG. 5 is a simulated graph of the gate to drain local interconnect parasitic capacitance component versus the distance between the gate to the drain local interconnect.

Referring to FIG. 5, another simulated graph is generated, using the simulation tool, Raphael, from Avant Corp. in Fremont, Calif., from entering in the dimensions of the MOSFET 102 into such a simulation tool, as available to one of ordinary skill in the art. The X-axis of the simulated graph of FIG. 5 has the first distance 230 between the virtual drain local interconnect 206 and the virtual conductive gate region 210 which also reflects the distance between the drain local interconnect 114 of the real MOSFET 102 and the conductive gate region 112 of the real MOSFET 102. The Y-axis of the simulated graph of FIG. 5 has the percentage of the gate to drain local interconnect parasitic capacitance component 220 "Cgdl" to the total gate capacitance of the MOSFET 102.

The simulated graph of FIG. 5 indicates that a larger percentage of the gate to drain local interconnect parasitic capacitance component 220 "Cgdl" results for a smaller distance between the gate and the drain local interconnect. Thus, to minimize the gate to drain local interconnect parasitic capacitance component 220 and the gate to source local interconnect parasitic capacitance component 222, the first distance 230 "Md" and the second distance 232 "Ms" are designed to be substantially equal. The measure of (and the difference between) the gate to drain local interconnect parasitic capacitance component 220 and the gate to source local interconnect parasitic capacitance component 222 with the virtual field effect transistor 202 of the present invention indicates the deviation from such a design of the first distance 230 "Md" being equal to the second distance 232 "Ms."

The foregoing is by way of example only and is not intended to be limiting. For example, the MOSFET device is by way of example only, and the present invention may be used for any type of field effect transistor having a drain local interconnect, a source local interconnect, and a conductive gate region, as would be apparent to one of ordinary skill in the art from the description herein. In addition, the virtual conductive gate region 210 and the conductive gate region 112 of the real MOSFET 102 may be comprised of polysilicon or of any other type of conductive material amenable for forming a gate of a field effect transistor, as would be apparent to one of ordinary skill in the art from the description herein. Furthermore, the virtual drain local interconnect 206, the virtual source local interconnect 208, the drain local interconnect 114 of the real MOSFET 102, and the source local interconnect 116 of the real MOSFET 102 may be comprised of tungsten or any other type of conductive material amenable for forming a local interconnect of a field effect transistor, as would be apparent to one of ordinary skill in the art from the description herein.

Furthermore, as will be understood by those skilled in the art, the integrated circuit structures described herein may be made or used in the same way regardless of their position and orientation. Accordingly, it is to be understood that terms and phrases such as "on" and "under" as used herein refer to the relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A virtual field effect transistor for determining a first parasitic capacitance component between a conductive gate region to a drain local interconnect of a real field effect transistor, and for determining a second parasitic capacitance component between said conductive gate region to a source local interconnect of said real field effect transistor, said virtual field effect transistor comprising:

a virtual drain local interconnect fabricated on a dielectric, said virtual drain local interconnect having a size that is substantially equal to a size of said drain local interconnect of said real field effect transistor;

a virtual source local interconnect fabricated on said dielectric, said virtual source local interconnect having a size that is substantially equal to a size of said source local interconnect of said real field effect transistor;

a virtual conductive gate region fabricated on said dielectric, said virtual conductive gate region having a size that is substantially equal to a size of said conductive gate region of said real field effect transistor;

and wherein positions of said virtual drain local interconnect, said virtual source local interconnect, and said virtual conductive gate region, relative to each other on said dielectric, are substantially same as positions of said drain local interconnect of said real field effect transistor, said source local interconnect of said real field effect transistor, and said conductive gate region of said real field effect transistor, relative to each other; and a virtual dielectric region fabricated on said dielectric to surround said virtual drain local interconnect, said virtual source local interconnect, and said virtual conductive gate region, and wherein said virtual dielectric region is substantially same as a dielectric region that surrounds said drain local interconnect of said real field effect transistor, said source local interconnect of said real field effect transistor, and said conductive gate region of said real field effect transistor;

and wherein said first parasitic capacitance component between said conductive gate region of said real field effect transistor to said drain local interconnect of said real field effect transistor is a first capacitance measured between said virtual conductive gate region and said virtual drain local interconnect;

and wherein said second parasitic capacitance component between said conductive gate region of said real field effect transistor to said source local interconnect of said real field effect transistor is a second capacitance measured between said virtual conductive gate region and said virtual source local interconnect.

2. The virtual field effect transistor of claim 1, wherein said virtual field effect transistor and said real field effect transistor are MOSFETs (Metal Oxide Semiconductor Field Effect Transistors).

3. The virtual field effect transistor of claim 1, wherein said dielectric is a shallow trench isolation oxide.

4. The virtual field effect transistor of claim 1, wherein said dielectric is a field oxide.

5. The virtual field effect transistor of claim 1, wherein said conductive gate region of said real field effect transistor and said virtual conductive gate region are comprised of polysilicon.

6. The virtual field effect transistor of claim 1, wherein said drain local interconnect of said real field effect transistor, said source local interconnect of said real field effect transistor, said virtual drain local interconnect, and said virtual source local interconnect are comprised of tungsten.

7. The virtual field effect transistor of claim 1, wherein said first parasitic capacitance component and said second parasitic capacitance component determine a mismatch in a first distance, between said conductive gate region of said real field effect transistor and said drain local interconnect of said real field effect transistor, and a second distance, between said conductive gate region of said real field effect transistor and said source local interconnect of said real field effect transistor.

8. A virtual MOSFET (Metal Oxide Semiconductor Field Effect Transistor) for determining a first parasitic capacitance component between a conductive gate region to a drain local interconnect of a real MOSFET (Metal Oxide Semiconductor Field Effect Transistor), and for determining a second parasitic capacitance component between said conductive gate region to a source local interconnect of said real MOSFET, said virtual MOSFET comprising:

a virtual drain local interconnect fabricated on a shallow trench isolation oxide, said virtual drain local interconnect having a size that is substantially equal to a size of said drain local interconnect of said real MOSFET;

a virtual source local interconnect fabricated on said shallow trench isolation oxide, said virtual source local interconnect having a size that is substantially equal to a size of said source local interconnect of said real MOSFET;

a virtual conductive gate region fabricated on said shallow trench isolation oxide, said virtual conductive gate region having a size that is substantially equal to a size of said conductive gate region of said real MOSFET;

and wherein positions of said virtual drain local interconnect, said virtual source local interconnect, and said virtual conductive gate region, relative to each other on said shallow trench isolation oxide, are substantially same as positions of said drain local interconnect of said real MOSFET, said source local interconnect of said real MOSFET, and said conductive gate region of said real MOSFET, relative to each other; and a virtual dielectric region fabricated on said shallow trench isolation oxide to surround said virtual drain local interconnect, said virtual source local interconnect, and said virtual conductive gate region, and wherein said virtual dielectric region is substantially same as a dielectric region that surrounds said drain local interconnect of said real MOSFET, said source local interconnect of said real MOSFET, and said conductive gate region of said real MOSFET;

and wherein said first parasitic capacitance component between said conductive gate region of said real MOSFET to said drain local interconnect of said real MOSFET is a first capacitance measured between said virtual conductive gate region and said virtual drain local interconnect;

and wherein said second parasitic capacitance component between said conductive gate region of said real MOSFET to said source local interconnect of said real MOSFET is a second capacitance measured between said virtual conductive gate region and said virtual source local interconnect;

and wherein said conductive gate region of said real MOSFET and said virtual conductive gate region are comprised of polysilicon;

and wherein said drain local interconnect of said real MOSFET, said source local interconnect of said real MOSFET, said virtual drain local interconnect, and said virtual source local interconnect are comprised of tungsten;

and wherein said first parasitic capacitance component and wherein said second capacitance component determine a mismatch in a first distance, between said conductive gate region of said real MOSFET and said drain local interconnect of said real MOSFET, and a second distance, between said conductive gate region of said real MOSFET and said source local interconnect of said real MOSFET.

9. A method for determining a first parasitic capacitance component between a conductive gate region to a drain local interconnect of a real field effect transistor, and for determining a second parasitic capacitance component between said conductive gate region to a source local interconnect of said real field effect transistor, said method including steps of:

fabricating a virtual drain local interconnect on a dielectric, said virtual drain local interconnect having a size that is substantially equal to a size of said drain local interconnect of said real field effect transistor;

fabricating a virtual source local interconnect on said dielectric, said virtual source local interconnect having a size that is substantially equal to a size of said source local interconnect of said real field effect transistor;

fabricating a virtual conductive gate region on said dielectric, said virtual conductive gate region having a size that is substantially equal to a size of said conductive gate region of said real field effect transistor;

and wherein positions of said virtual drain local interconnect, said virtual source local interconnect, and said virtual conductive gate region, relative to each other on said dielectric, is substantially same as positions of said drain local interconnect of said real field effect transistor, said source local interconnect of said real field effect transistor, and said conductive gate region of said real field effect transistor, relative to each other;

fabricating a virtual dielectric region on said dielectric to surround said virtual drain local interconnect, said virtual source local interconnect, and said virtual conductive gate region, and wherein said virtual dielectric region is substantially same as a dielectric region that surrounds said drain local interconnect of said real field effect transistor, said source local interconnect of said real field effect transistor, and said conductive gate region of said real field effect transistor;

measuring a first capacitance between said virtual conductive gate region and said virtual drain local interconnect to determine said first parasitic capacitance component between said conductive gate region of said real field effect transistor to said drain local interconnect of said real field effect transistor; and measuring a second capacitance between said virtual conductive gate region and said virtual source local interconnect to determine said second parasitic capacitance component between said conductive gate region of said real field effect transistor to said source local interconnect of said real field effect transistor.

10. The method of claim 9, wherein said field effect transistor is a MOSFET (Metal Oxide Semiconductor Field Effect Transistor).

11. The method of claim 9, wherein said dielectric is a shallow trench isolation oxide.

12. The method of claim 9, wherein said dielectric is a field oxide.

13. The method of claim 9, wherein said conductive gate region of said real field effect transistor and said virtual conductive gate region are comprised of polysilicon.

14. The method of claim 9, wherein said drain local interconnect of said real field effect transistor, said source local interconnect of said real field effect transistor, said virtual drain local interconnect, and said virtual source local interconnect are comprised of tungsten.

15. The method of claim 9, further including the step of:
determining a mismatch in a first distance, between said conductive gate region of said real field effect transistor and said drain local interconnect of said real field effect transistor, and a second distance, between said conductive gate region of said real field effect transistor and said source local interconnect of said real field effect transistor, from said first parasitic capacitance component and said second parasitic capacitance component.

* * * * *